United States Patent [19]

Wong et al.

[11] Patent Number: 5,470,821
[45] Date of Patent: Nov. 28, 1995

[54] SUPERCONDUCTORS HAVING CONTINUOUS CERAMIC AND ELEMENTAL METAL MATRICES

[75] Inventors: Kai W. Wong; Xin Fei; Ying Xin, all of Lawrence, Kans.; Yi-Han Kao, Williamsville, N.Y.

[73] Assignees: The University of Kansas; Midwest Superconductivity, Inc., both of Lawrence, Kans.

[21] Appl. No.: 389,544

[22] Filed: Feb. 15, 1995

Related U.S. Application Data

[63] Continuation of Ser. No. 67,267, May 21, 1993, abandoned, which is a continuation of Ser. No. 892,199, Jun. 2, 1992, abandoned, which is a continuation-in-part of Ser. No. 865,074, Apr. 8, 1992, abandoned, which is a continuation-in-part of Ser. No. 844,736, Mar. 2, 1992, abandoned.

[51] Int. Cl.⁶ .......................... H01B 12/00; H01L 39/12
[52] U.S. Cl. .................. 505/236; 505/100; 505/230; 505/432; 505/783; 505/124; 505/785; 252/518; 252/521; 428/547; 428/553; 428/164; 428/539.5
[58] Field of Search ..................... 505/100, 230, 505/432, 491, 785, 704, 783, 124; 252/518, 521; 428/547, 553, 164, 539.5

[56] References Cited

U.S. PATENT DOCUMENTS

| | | | |
|---|---|---|---|
| 4,826,808 | 5/1989 | Yurek et al. | 505/100 |
| 4,892,861 | 1/1990 | Ray | 505/785 |
| 4,952,554 | 8/1990 | Jin | 505/704 |
| 4,968,663 | 11/1990 | Whang | 505/100 |
| 4,988,673 | 1/1991 | Ferrando | 505/100 |
| 4,999,338 | 3/1991 | Wijeyesekera et al. | 505/100 |
| 5,034,373 | 7/1991 | Smith et al. | 505/100 |
| 5,041,414 | 8/1991 | Reich | 505/100 |
| 5,041,416 | 8/1991 | Wilson | 505/100 |
| 5,071,826 | 12/1991 | Anderson et al. | 505/100 |
| 5,082,826 | 1/1992 | Ferrando | 505/100 |
| 5,089,467 | 2/1992 | Murr | 423/344 |
| 5,091,362 | 2/1992 | Ferrando | 505/100 |
| 5,093,314 | 3/1992 | Takahashi | 505/704 |
| 5,145,835 | 9/1992 | Takeshita | 505/704 |
| 5,248,661 | 9/1993 | Mole et al. | 505/785 |

FOREIGN PATENT DOCUMENTS

| | | |
|---|---|---|
| 2088407A | 9/1988 | Japan . |
| 2192401A | 1/1989 | Japan . |

OTHER PUBLICATIONS

Goyal "Cermets at the Y Ba₂ Cu₃O₇₋δ Superconductors" *Materials Letters* v. 6(8,9) May 1988 pp. 257–260.

Adair "Dynamic Compaction of Ceramic Powders" *Mater. Sci. Research v. 17: Emergent Process for High-Technology Ceramics* 1982 No Month Available.

Tien "Hot Isostatic Pressing (HIP) for Densification of Oxidation" MRS: High Temp Super II Apr. 1988 pp. 73–76.

(List continued on next page.)

*Primary Examiner*—Paul Lieberman
*Assistant Examiner*—M. Kopec
*Attorney, Agent, or Firm*—Hovey, Williams, Timmons & Collins

[57] ABSTRACT

Composite bulk superconducting materials having desirable physical, measured transport current density and high $T_c$ superconducting characteristics are provided which comprise a first matrix of superconducting ceramic oxide crystalline grains with a second matrix of elemental metal (gold, silver, palladium and tin) situated within the interstices between the crystalline grains. Preferably, each matrix is a continuous phase within the composite material, with the ceramic oxide preferably being present at a level of at least about 80% by weight, whereas the elemental metal is present at a level of up to about 20% by weight. In fabrication procedures, a precursor superconducting ceramic oxide is first prepared and reduced to a fine powder size; this is mixed with powdered elemental metal, and the mixture is compressed using high compaction pressures on the order of 14 tons/cm² or greater to form a body, which is then sintered to yield the composite. Particularly preferred composites include a mixed metallic matrix including respective quantities of tin and a noble metal.

13 Claims, 10 Drawing Sheets

OTHER PUBLICATIONS

Japanese J. Appl. Physics, vol. 28, No. 11, Nov., 1989, pp. L1936–L1938; Kubo, et al.; Preparation of a Ag–Doped Bi–Sr–Ca–Cu–O Bulk Sample by the Floating Zone Method.

Physica C 185–189 (1991) 2423–2424 North–Holland; Kato, et al.; Critical Current Densities of Hot Pressed YBA2CU307–alpha–Ag Thick Film No Month Avaiable.

Ho, et al.; J. Mater. Res., vol. 4, No. 6, Nov./Dec. ]1989; Carbon Fiber.

Z. Phys. B–Condensed Matter 83, 327–331 (1991); Imanaka, et al.; Superconducting properties of gold powder mixed Bi–Pb–Sr–Ca–Cu–O Composites No Month Available.

Physica C 179 (1991) 361–368 North–Holladn; Savvides, et al.; Critical current Density and flux pinning in silver/superconductor composites and tapes.

Extended Abstracts; High–Temperature Superconductors II; Apr. 5–9, 1988; Reno, Nev.; Garland, et al.; *A Novel Metal Matrix High Tc Superconducting Composite;* pp. 319–321.

Appl Phys. Lett. 52 (19), 9 May 1988; Jin, et al.; *Superconductivity in the Bi–Sr–Ca–Cu–O compounds with noble metal additions.*

*Advances in Superconductivity II.* Proceedings of the 2nd International Symposium on Superconductivity (ISS '89), Nov. 14–17, 1989, pp. 273–276; Michishita.

Japanese Journal of Applied Physics, vol. 30, No. 7B, Jul., 1991, pp. L 1256–L 1259; Lin, et al; Electrical Transport in the Ag–Bi2–Srl.8–Cal.2–Cu2 *Oy Composite System.*

High Temperature Superconducting Compounds: Processing & Related Properties; Curreri, et al.; pp. 142–154; Proceedings of the 1989 Symposium on High Temperature Superconducting Oxides; Processing and Properties of High Tc Oxide/Silver Matrix Composite Superconductors No Month Available.

Solid State Communications, vol. 69, No. 11, pp. 1067–1071, 1989; Su, et al.; Effects of Ag Doping on the Critical Current Density of YBa2Cu307–y No Month Available.

J. Appl. Phys. 67 (11), 1 Jun. 1990; Cukauskas, et al.; The Properties of YlBa2Cu307–alpha thin films with silver doping prepared by spray pyrolysis.

Solid Stat Communications, vol. 75, No. 8. Pp. 625–627, 1990. Yufang, et al.; The Effect of Ag on the Superconductivity of Bi–Pb–Sr–Ca–Cu–O No Month Available.

Wei, et al.; The Effects of Ag–Doping on the Magnetic Properties of Bia.6PbO.4 Sr2Ca2Cu3Oy; pp. 273–275.

J. Electrochem. Soc.: Accelerated Brief Communication, Oct. 1987; pp. 2635–2636; Yurek, et al.; Direct Synthesis of a Metal/Superconducting Oxide Composite by Oxidation of a Metallic Precursor.

Physica C 173 (1991) 195–200 North–Holland; Critical Current density Enhancement in YBa2–Cu307–x silver composite superconductor; Kozlowski, et al. No Month Available.

Appl. Phys. A 49, 139–141 (1989); Baliga, et al.; Enhanced Grain Growth in YBa2Cu307–alpha Doped with Ag, Cu and CuO No Month Available.

Tang, et al.; Critical Current Density of Ag_Matrix YBCO Superconducting Tape by Powder Rolling: pp. 168–170.

Apply. Phys. Lett. 57(2), 9 Jul. 1990; Komatsu, et al.; Preparation of Ag–Coated Superconducting Bi2Sr2CaCu20x Glass–Ceramic Fibers, pp. 183–185.

Appl. Phys. Lett. 52(26), 27 Jun. 1988; Sekine, et al.; Fabrication of Multifilamentary Y–Ba–Cu–O Oxide Superconductors; pp. 2261–2262.

Mat. Res. Bull., vol. 24, pp. 1469–1475, 1989; Ag Doping Effects on the Superconduction of Bi–(Pb)–Sr–Ca–Cu–O Ceramics: Matsumoto, et al. No Month Available.

Zhou, et al.; Sn Substitution of T1BaCaCuO Superconductors; Chinese Phys. Lett., vol. 8, No. 6 (1991) 303 No Month Available.

Aleksandrov, et al.; Tin–Based High–Temperature Superconductor; JETP Lett., vol. 49, No. 12, 25 Jun. 1989.

Osamura, et al.; Improvement of Critical Current Density in $YBa_2Cu_3O_{6+x}$ Superconductor by Sn Addition, Jpn J. Appl. Phys. 29, No. 9, Spe., 1990, pp. L 1621–L1623.

Fig.12
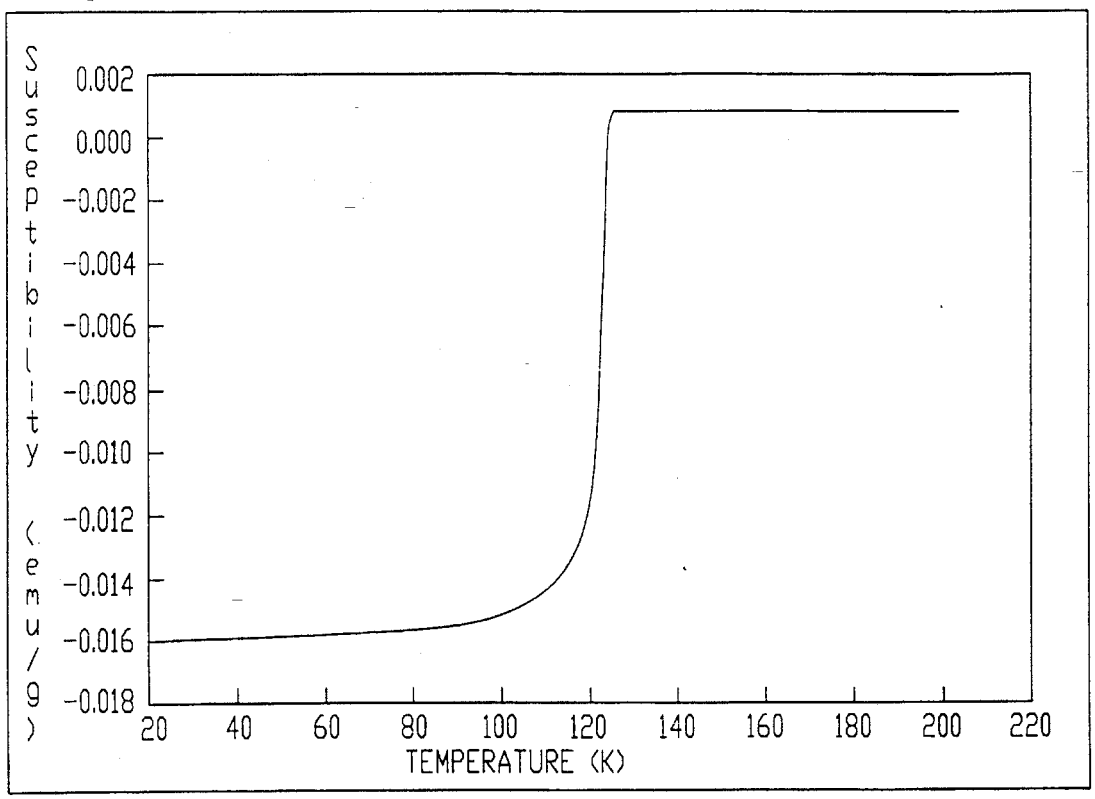
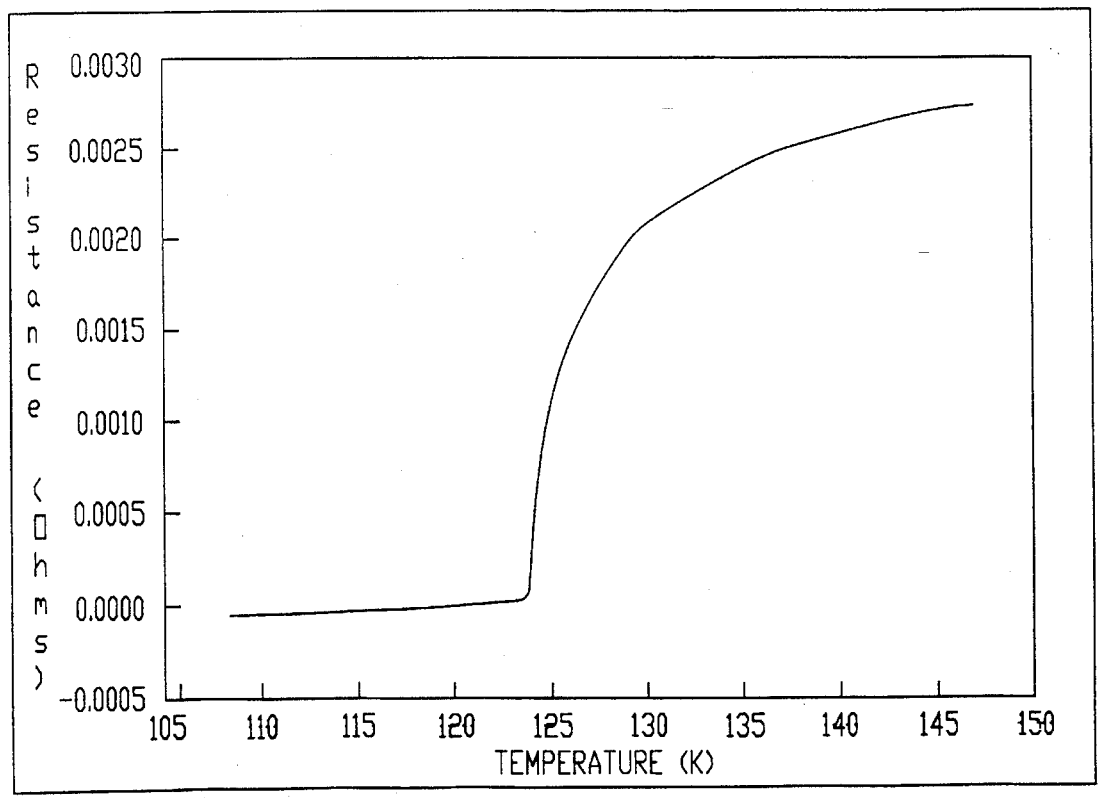
Fig.11.

Fig. 16.
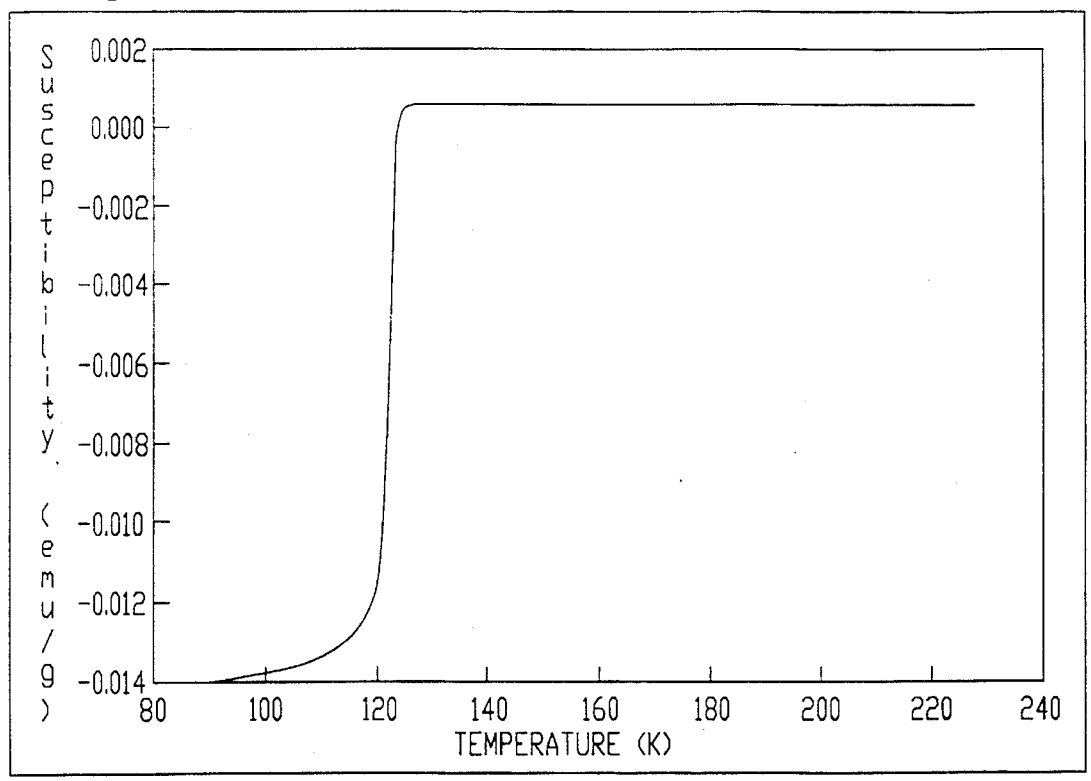
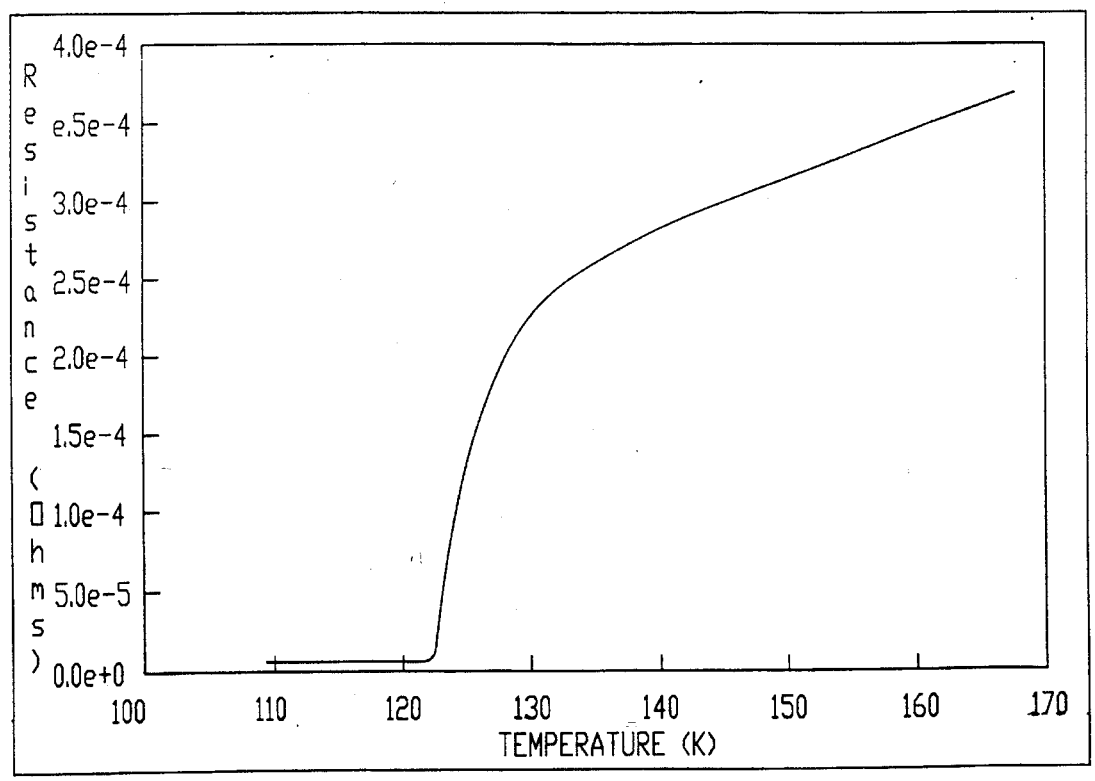
Fig. 15.

SUPERCONDUCTORS HAVING CONTINUOUS CERAMIC AND ELEMENTAL METAL MATRICES

This application is a continuation application of prior application Ser. No. 08/067,267, filed May 21, 1993, now abandoned, which is a continuation of Ser. No. 07/892,199, filed Jun. 2, 1992, now abandoned, which is a continuation-in-part of Ser. No. 07/865,074, filed Apr. 8, 1992, now abandoned, which is a continuation-in-part of Ser. No. 07/844,736, filed on Mar. 2, 1992, now abandoned.

BACKGROUND OF THE INVENTION

1. Field of the Invention

The present invention is broadly concerned with novel superconducting bulk materials made up of precursor superconducting ceramic oxide crystals (either single or multiple phase) with substantially non-reactive elemental metal in the interstices between ceramic crystals so that the composite materials include respective superconducting and continuous metallic matrices. These materials exhibit desirable ductilities, the ability to carry high D.C. voltage-induced transport critical current densities, and enhanced magnetic properties. The resulting composite materials have $T_c$ values not substantially depressed as compared with the $T_c$ values of the precursor superconducting ceramic oxides, in the absence of an elemental metal matrix. The invention also comprehends the method of fabricating the ceramic oxide/elemental metal superconductors, wherein the ceramic oxide is first fabricated to completion, followed by grinding, mixing with the elemental metal powder, high pressure compaction of the mixture and final sintering.

2. Description of the Prior Art

Superconductivity refers to that special state of a material where its resistance to electrical current flow suddenly and completely disappears when its temperature is lowered. Below this onset or critical temperature $T_c$, a characteristic of the material, the electrical resistance does not merely drop to a low level but it vanishes entirely. Only a very limited list of materials exhibit such a state. The discovery of the first superconductor occurred in 1911. Heike Kammerlingh Onnes discovered that Mercury lost all detectable resistance at a temperature just 4° above absolute zero.

A superconductor also exhibits perfect diamagnetism below its critical temperature, i.e., it expels all magnetic field lines from its interior by producing an opposing magnetic field from a current flowing on its surface. As a consequence of the perfect diamagnetism of superconductors, they can be used to produce magnetic levitation as envisioned in high speed transport systems of the future, where magnetic repulsion is used to counter gravity. The perfect diamagnetism property of superconductors is called the Meissner effect after its discoverer.

Superconductivity is the only large scale quantum phenomenon involving charges found in solid materials. The current-carrying electrons in the superconductor behave as if they were part of a monumentally large single molecule the size of the entire specimen of the material. The macroscopic quantum nature of superconductors makes them useful in measuring magnetic field quantities to high precision or facilitates the measurement of such quantities so small as to be heretofore unmeasurable.

Despite the tremendous potential of superconductors, and the extensive research heretofore undertaken to develop these materials, a number of formidable problems remain. For example, ceramic oxide superconductors are in general very brittle, and this is also true for the most desirable high $T_c$ superconductors. Thus, while there exists a wide range of ductilities between different families of high $T_c$ ceramic oxide superconductors (e.g., the bismuth-vanadium family is more ductile than the rare earth or thallium families), in general it is very difficult to drill, saw or otherwise mechanically reduce ceramic superconductors without cracking or breakage thereof.

In addition, the crystalline structure of prior ceramic superconductors can be difficult to create, and numerous intergranular weak links are typically present. These weak links can be viewed as S-I-S (superconducting-insulating-superconducting) junctions and tend to substantially lessen the superconducting current densities that can be carried by these materials. Finally, all ceramic oxide superconductors are Type II superconductors. As such, quantized magnetic fluxoids are formed in the presence of an external magnetic field. The ceramic superconductors have relatively large penetration depths, and therefore the presence of large arrays of fluxoids will decrease the electro-magnetic shielding properties of these materials. Moreover, the lack of pinning centers allows for easy merging of the fluxoids, thus quenching superconductivity characteristics altogether.

SUMMARY OF THE INVENTION

The present invention overcomes many of the problems outlined above and provides greatly improved composite superconducting materials characterized by a first matrix of precursor superconducting ceramic oxide crystalline grains, and a second matrix of elemental metal situated within the interstices between crystalline grains. These composite materials have significantly reduced frangibility, extremely high measured D.C. voltage-induced transport current densities, and $T_c$ values not significantly depressed as compared with the $T_c$ value of the precursor superconducting oxides employed in the absence of an elemental metal matrix.

In particular, the invention is concerned with superconducting composite materials in sintered bulk body form wherein the bodies are formed entirely from compressed particulates, i.e., both the precursor oxide and elemental metal are in powder form and are compacted to create a final composite preferably having a thickness of at least about 0.2 mm. The resultant composite bulk bodies have an elemental metal matrix which is essentially uniformly distributed throughout the body except in the region of the outer surface layer thereof. This outer surface layer region is in the form of an essentially continuous and essentially homogeneous elemental metal.

Actual testing of the bulk composite superconducting materials of the invention demonstrates that they exhibit measured (as opposed to calculated) D.C. voltage-induced transport current densities greatly in excess of those heretofore reported for bulk superconductors. Specifically, bodies in accordance with the invention exhibit either a transport current densities of at least about 1500 amps/cm$^2$ at zero applied magnetic field and a body temperature of 77K, or transport current densities of at least 250 amps/cm$^2$ at 1 Tesla applied magnetic field and a body temperature of about 77K; preferably, the bulk bodies should exhibit both of these transport current density levels.

The ceramic oxide fraction of the composites is normally present at a level of at least about 40% by weight based upon the total weight of the material, and more preferably at least about 80% by weight; the most preferred level of use is from about 80–90% by weight. The precursor ceramic oxide can be selected from a wide variety of possible candidates, depending upon the desired $T_c$ level for the final composite superconductor. Ceramic copper oxide superconductors may be viewed as the ordered stacking of the cubic structures $RCuO_2$, $MCuO_5$ and $TMCuO_4$, where R is selected from the group consisting of the rare earth metals and calcium, M is selected from the group consisting of barium and strontium, and T is selected from the group consisting of bismuth, thallium and vanadium. These cubic structures can be stacked in a large number of ways, e.g., unit cells may be directly repeated, or can be shifted along the TO plane and inverse stacked, when the $TMCuO_4$ cubic structure is present. Such techniques will yield superconducting oxides, such as those of the 112, 214, 123, 2201, 1212, 1223, 2212 and 2223 families of superconducting oxides. It has also been found that the starting superconducting ceramic oxides useful in the invention may be either single or multiple phase where the phases are in the same crystalline family, e.g., mixed phase oxides having Tl-1223 and Tl-2223 phases, or Tl-2223 and Tl-2212 phases may be used.

The elemental metal matrix is preferably from the group consisting of gold, silver, palladium and tin, with gold being the most preferred metal. It has been found that platinum is not a useful metal. Where the metal used is gold, it may be present in the matrix at a level of up to about 60% by weight. More generally, the level should be up to about 20% by weight, and most preferably from about 3–20% by weight, particularly where tin is one of the elemental metals used. Where the metal fraction of the composites consists essentially of tin, a tin level of from about 3–7% by weight is preferred. At levels as high as 60% gold, the preferred composites still exhibit zero resistivity below the critical temperature; however, Meissner effects are degraded. At elemental metal levels of about 20% by weight or less, there is no significant Meissner effect degradation, and for this reason this level of use is preferred. Moreover, at the preferred level the density of the ceramic oxide fraction is the same or greater than the density of the starting oxide, indicating that the elemental metal is simply filling the interstices between the crystalline grains of ceramic oxide.

In fabrication procedures, the composite superconducting ceramic oxide/elemental metal materials of the invention are formed by initially fabricating a precursor superconducting ceramic oxide using known techniques, followed by reducing this oxide to a fine powder of crystalline superconducting grains. The average grain size should be up to about $10^{-3}$ mm, and most preferably about $10^{-4}$ mm. In the next step, the powdered oxide grains are mixed with a quantity of a powdered elemental metal, with the latter having an average particle size as set forth above. These materials are mixed to assure uniformity.

The ceramic oxide/elemental metal mixture is then compressed to form a self-sustaining body, which preferably involves using a pressure of at least about 14 tons/cm². This assures that in the body the elemental metal is situated within the interstices between the ceramic grains. It has been determined that use of such relatively high compaction pressures (most prior art techniques use compaction pressures on the order of 2–5 tons/cm²) is important in providing bulk superconductors exhibiting the desirable properties of high transport current densities without lowering $T_c$ values.

The final step involves sintering the compressed body to create the desired superconducting material. Generally speaking, sintering involves heating at a temperature of from about 700°–850° C. for a period of from about 2–72 hours. Depending upon the time/temperature conditions during the final sintering, the ceramic oxide matrix may be of single or multiple phases. For example, an essentially single phase starting ceramic oxide may be transformed during the final sintering step to a multiple phase condition.

The composites of the invention, by virtue of their desirable physical properties, can be formed into a variety of shapes. For example, such composites may be pressed into films having a thickness less than a sheet of paper, and this film can be rolled or otherwise formed into final products.

The invention also comprehends the use of elemental tin as at least a part of the metallic matrix. In such cases, annealing temperatures are selected such that during annealing the tin fraction melts. This is in contrast to composites fabricated using one or more of the noble metals alone (gold, silver or palladium) where no such melting occurs. In the use of the noble metals, it is important that these not undergo melting, so as to generate pinning centers in the final products. On the other hand, melting of the tin during annealing creates a partially liquid state reaction which facilitates crystalline growth and ultimate formation of the composite. Therefore, a mixed metallic matrix comprising a noble metal together with tin provides the advantages of both increased pinning centers and crystalline growth, and therefore these composites are particularly preferred.

BRIEF DESCRIPTION OF THE DRAWINGS

FIG. 11 is a resistivity curve for the composite superconducting material made up of 87% by weight of single-phase thallium 2223 superconducting oxide, 5% by weight elemental tin, and 8% by weight gold;

FIG. 12 is a graph of a Meissner effect determination using the composite of FIG. 11;

FIG. 15 is a resistivity curve for a composite superconducting material made up of 95% by weight single phase thallium 2223 superconducting oxide and 5% by weight tin; and FIG. 16 is a the Meissner effect graph developed using the composite of FIG. 15.

DESCRIPTION OF THE PREFERRED EMBODIMENTS

The following examples describe a number of specific techniques for the production of composite superconducting oxide/elemental metal materials. It is to be understood that these examples are presented by way of illustration only, and nothing therein should be taken as a limitation upon the overall scope of the invention.

EXAMPLE 1

In this example, a Tl:Ba:Ca:Cu:O 2223 superconducting oxide was fabricated, along with a Tl:Ba:Ca:Cu:O 1223 oxide. Preferred techniques for such fabrications are set forth in co-pending application S/N 07/791,892 filed Nov. 13, 1991. This application is incorporated by reference herein.

Specifically, the starting oxides employed in each case were CaO (>99% pure), CuO (>99.95% pure), $BaO_2$ or BaO (>95% pure), and $Tl_2O_3$ (>99.99% pure).

The appropriate molar ratios of the above oxides sufficient to yield the oxides $Tl_2Ba_2Ca_2Cu_3O_{10-y}$ and $TlBa_2Ca_2Cu_3O_{9-y}$ were mixed in separate batches with a quantity of methanol to give a fluid mixture and ground in a laboratory machine mill for about 10 hours. The average particle size of each mixture was estimated to be on the order of 0.5 microns. The ground mixtures were then dried in a ventilation hood to remove the methanol. The dried mixtures were again ground to a fine powder using an agate mortar. Thereupon, the mixed powders were separately pelletized using a laboratory hydraulic press (15 tons/cm$^2$).

The respective pellets resulting from this process (typically ½–1" diameter and about ½" in thickness) were then placed inside a pair of closed-ended, tubular, telescopically interfitted alumina crucibles. This crucible was then placed in a tube furnace with oxygen flow through the furnace in the usual manner.

The pellets were sintered using the following heating schedule. The room temperature furnace was first heated to 700° C., using a heating rate of 2°–5° C./min. Thereafter, the furnace was further heated to 895°–900° C., at a heating rate of 20° C./min. When the furnace reached the maximum temperature, the furnace temperature was maintained at this maximum for 30 hours or longer. At the end of the holding period, the temperature of the furnace was reduced to 650°–700° C., at a cooling rate of 0.1°–2° C./min. The 650°–700° C. furnace temperature was maintained for 10 hours, whereupon the furnace was turned off and allowed to return to ambient.

Figure 1:
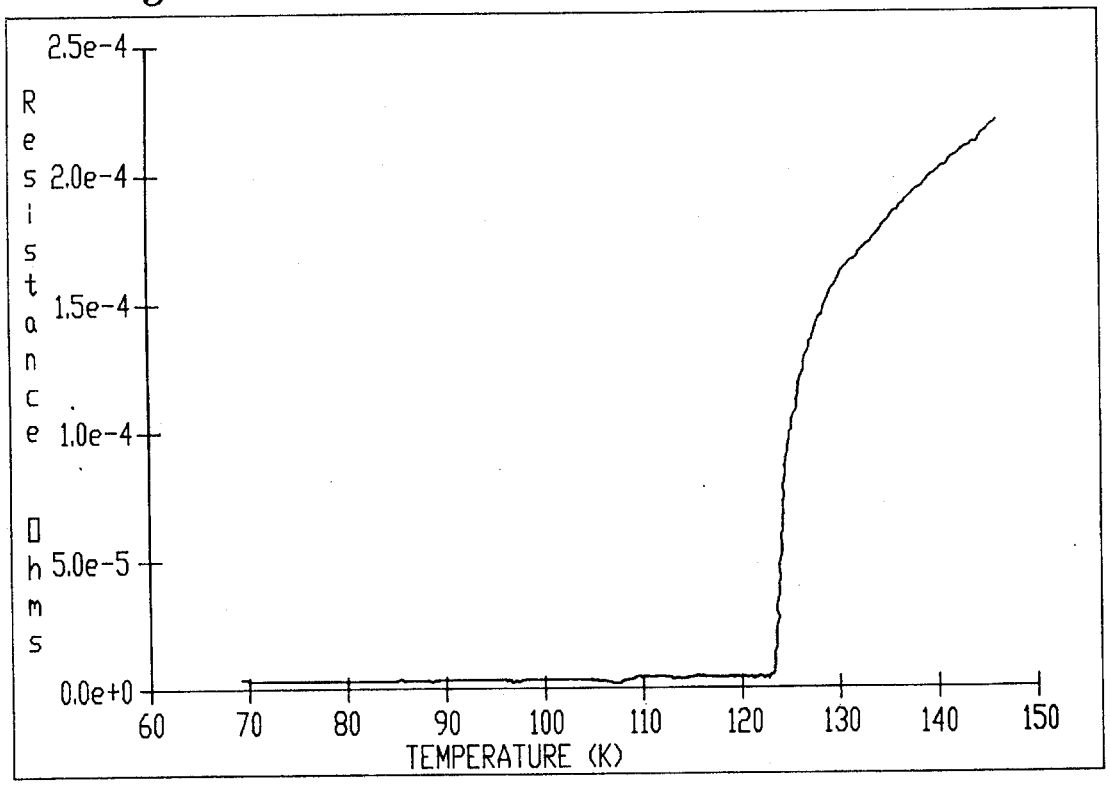
FIG. 1 is a resistivity curve for the composite superconducting material made up of 85% by weight of single phase thallium 2223 superconducting oxide, and 15% by weight gold.
Figure 2:
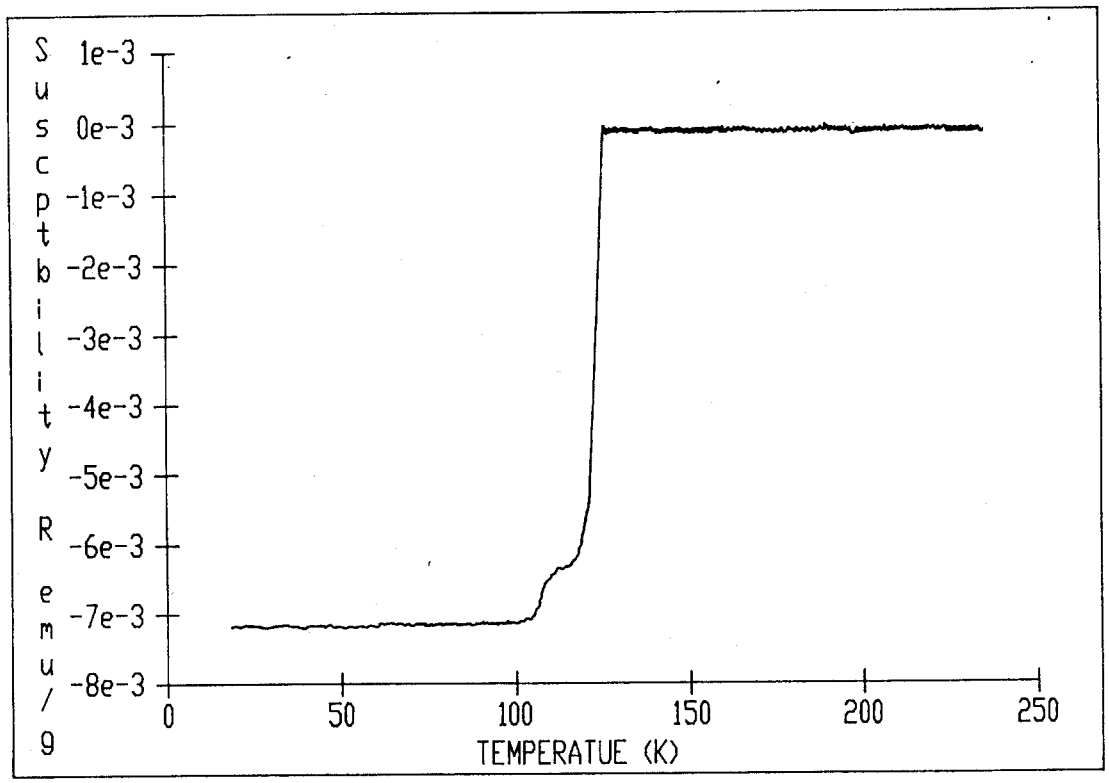
FIG. 2 is a graph of a Meissner effect determination made using the oxide of FIG. 1.

Following this initial fabrication step, the individual Tl-2223 and Tl-1223 ceramic oxides were separately reground in an agate mortar to an average grain size of about $10^{-4}$ mm. The resultant powders were then mixed with an appropriate quantity of elemental metal powder. In the case of the composite whose superconducting characteristics are depicted in FIGS. 1 and 2, the Tl-2223 oxide/elemental metal powders were mixed at a level of 85% ceramic oxide, 15% gold. In the case of the FIG. 3 composite, the ratio was 90% ceramic oxide, 10% silver, and in the FIG. 4 sample, 85% by weight of the Tl-1223 oxide and 15% by weight gold was used. The oxide/metal mixtures were then reground and care was taken to assure uniformity.

In the next step, each of the ceramic oxide/elemental metal mixtures was compressed into pellets using a hydraulic press at a pressure of at least about 14 tons/cm$^2$, and more preferably from about 14–25 tons/cm$^2$. The goal in such compression was to create a self-sustaining body wherein the elemental metal is formed as a matrix and is situated within the interstices between the ceramic oxide crystalline grains. After compression, the pellets give the appearance and color of the elemental metal being used. Thus, if the elemental metal was gold, the compressed pellet exhibited a definite gold appearance.

The final step in producing the material of the invention involved sintering the compressed composite bodies. Generally speaking, the sintering should be carried out so as to heat the bodies as close to the ceramic oxide formation temperature as possible without causing deoxidation thereof. The latter phenomenon can occur if the metal fraction is heated to a temperature which will cause it to react with oxygen atoms within the crystalline grains, thus disrupting the superconducting properties thereof. Accordingly, it has been found that when gold is used as the elemental metal, the maximum sintering temperature should be up to about 800° C. whereas for silver, the maximum sintering temperature should be up to about 760° C., and for palladium, up to about 730° C.

In all cases, it is preferred to first wrap the compressed body in silver foil to prevent surface oxidation, whereupon the wrapped body is placed in an $Al_2O_3$ tube which is then placed within a Lindberg or equivalent tube furnace. Continuous oxygen is passed through the tube furnace while the body is sintering. In particularly preferred forms, the sintering process is stepwise, involving a gradual increase of the furnace temperature at a rate of 1° C. until the maximum sintering temperature is reached, whereupon the furnace is maintained at its maximum temperature for a period of 2–8 hours. At this point, the bodies are allowed to cool to room temperature, at a descending rate of 1° C./min.

During the sintering process, the gold-containing bodies lose most of the golden luster apparent after compression. However, the electrical resistivity of such bodies at room temperature remains very close to that of metallic gold. Furthermore, the mechanical properties of the material are attractive, exhibiting increased ductility making it easy to drill or saw through the bodies without producing cracks.

The resistivity-temperature curve of the resultant Tl-2223/gold composite material is depicted in FIG. 1. The critical temperature $T_c$ below which the material loses all resistivity, is about 123K, very similar to the best pure Tl-2223 ceramic oxide. FIG. 2 gives the magnetic susceptibility results obtained using this composite, and surprisingly demonstrates a magnetic susceptibility below the critical temperature which in fact is larger than that observed for the pure ceramic oxide Tl-2223 material.

It has also been found that the Tl-2223/gold composite of the invention is capable of suspending a magnet six times its own weight at 78K, and can easily be suspended below a magnet at a distance from the magnet as large as 0.5 inches. This is a qualitative indication that the composite material of the invention can carry relatively high critical transport current densities. Indeed, measurements of current density in similar composites bear out this qualitative indication. Specifically, an 80% by weight Tl:Ba:Ca:Cu:O 2223 ceramic oxide/20% by weight gold composite made in accordance with the foregoing procedure was tested for critical current density. At liquid helium temperature (about 5K), the intragrain critical current density with no applied electromagnetic field was measured by a SQUID to be $10^8$ amperes/$cm^2$, and at liquid nitrogen temperatures (about 77K), the transport intergrain current density was 1,000–2,000 amperes/$cm^2$. An additional determination was made with this composite at liquid nitrogen temperature with a one Tesla applied magnetic flux, and the critical transport current density was found to be 250 amperes/$cm^2$. These results demonstrate that the composites of the invention can carry critical current densities two orders higher than those of the ceramic oxide from which they are made.

It has also been found that after factoring out the mass density of gold from the composite, the Tl-2223 ceramic oxide matrix is actually more dense than in the originally fabricated oxide. This feature demonstrates that the interstices between the ceramic oxide grains are not only filled by the elemental metal but in fact these interstices are also reduced in size. Thus, the composites will carry a larger intergranular supercurrent. In effect, the composites of the invention have S-N-S (super-conducting-metal-superconducting) junctions (as opposed to the usual S-I-S junctions found in conventional ceramic oxides) which cause a large increase in the transport current density through these links. The composites hereof thus behave more like a metal superconductor when carving a bridge. In a pure ceramic oxide, a rf SQUID signal can be observed with a large bridge size of 0.1 mm, but in the case of the composites of the invention, a rf SQUID signal cannot be observed down to a bridge size of 0.03 mm, which is an indirect indication of high $J_c$ in the material.

The presence of noble metal in the interstices between the ceramic oxide grains also creates effective pinning centers, thus reducing the mobility of the magnetic fluxoids. As a consequence, the superconductivity of the composites is maintained and quenching is avoided.

These results demonstrate that the composite materials of the invention are fundamentally different from prior ceramic oxides which have been doped with silver oxide in an attempt to increase the current density carrying capacity of the oxides. In the latter case, $Ag_2O$ is mixed with the remaining starting oxides, which are all sintered together to form a final crystalline structure. In such a case, the silver atoms are actually within the confines of the ceramic crystals, and the silver is bonded with oxygen atoms therein. In the present invention, however, the elemental metal is not oriented within the ceramic oxide crystalline structure, but rather is situated within the interstices between crystalline grains; and the elemental-metal is not bonded with oxygen atoms found in the crystalline structure. Thus the present invention involves the use of an elemental metal matrix, which is significantly different from prior doping efforts.

Figure 3:
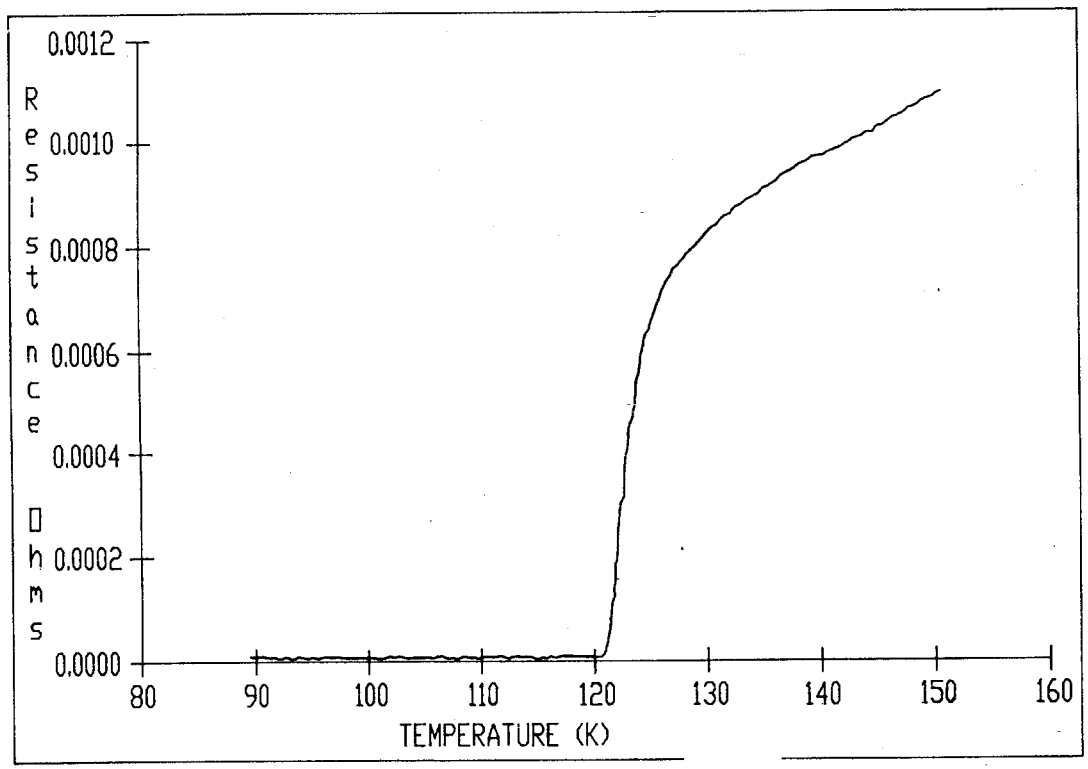
FIG. 3 is a resistivity curve for the composite superconducting material made up of 90% by weight of single phase thallium 2223 superconducting oxide, and 10% by weight silver.

FIG. 3 is an R-T curve generated using a 90% by weight Tl:Ba:Ca:Cu:O 2223 ceramic oxide made as set forth above, with 10% by weight silver. The fabrication of this composite differs from that described above only in the final sintering step, and in that case, the maximum sintering temperature used was 760° C. In all other respects, the sintering method was as previously described. The FIG. 3 curve illustrates that the ceramic oxide/silver composite has a $T_c$ slightly above 120K.

Figure 4:
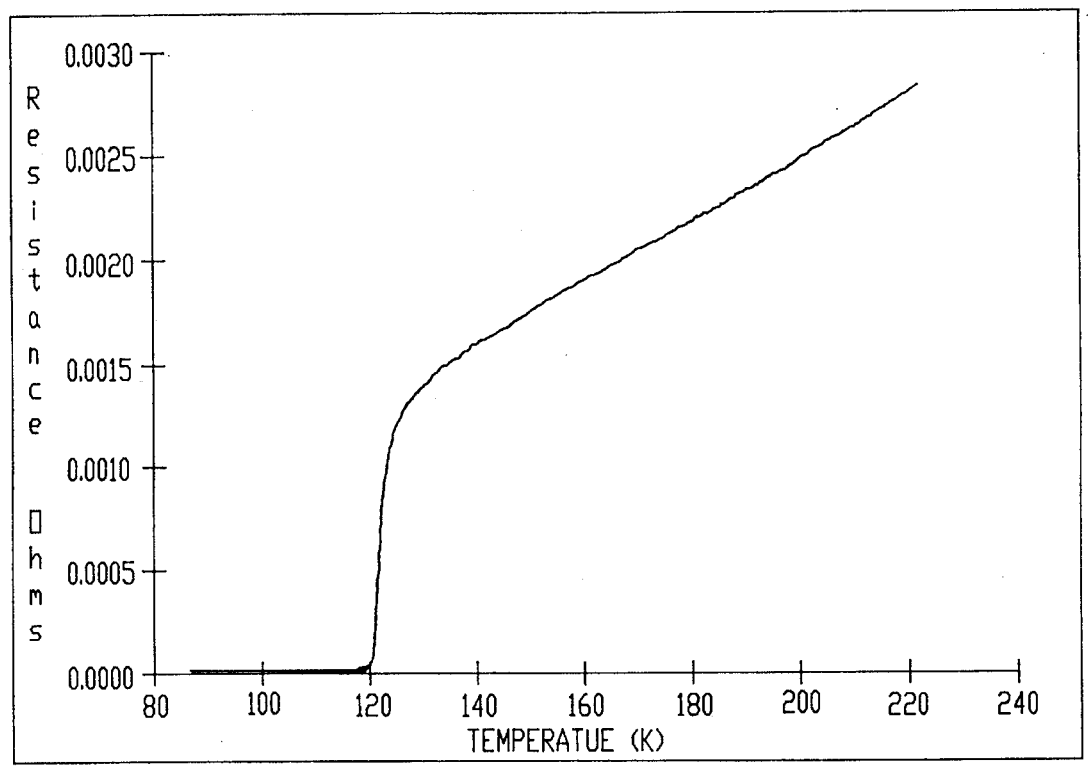
FIG. 4 is a resistivity curve for the composite superconducting material made up of 85% by weight of single phase thallium 1223 superconducting oxide, and 15% by weight gold.

The FIG. 4 composite, formed of 85% by weight Tl:Ba:Ca:Cu:O 1223 ceramic oxide and 15% by weight gold, was likewise fabricated by first initially producing the ceramic oxide, followed by mixing with powdered gold, compression and sintering. The initial 1223 ceramic oxide was produced as described, and the subsequent steps in the production of the composite were identical with those described above. Very similar resistivity values can be obtained using SrO in lieu of BaO, as in Example 4.

A study of FIG. 4 will demonstrate that this composite gave a $T_c$ in excess of 120K.

EXAMPLE 2

In this example, a composite made up of 85% by weight $YBa_2Cu_3O_7$ and 15% by weight silver was fabricated. The starting ceramic oxide was made by mixing $Y_2O_3$ (>99.9%), $BaO_2$ (>95%) or $BaCO_3$ (>99.95) and CuO (>99.95%) in appropriate molar ratios of cations Y:Ba:Cu of 1:2:3, followed by grinding in an agate mortar. The ground powder was then heated in an alumina crucible at about 920° C. for about 20 hours. Thereafter, the fired powder was pelletized in a die with a hydraulic press. The crucible was then positioned in a tube furnace with oxygen flowing through the furnace. The sintering process involved the following schedule. The furnace temperature was raised at a rate of 1°–2° C./min from room temperature to about 965° C. whereupon the furnace was maintained at this temperature for 5 hours. The furnace temperature was then lowered to about 600° C. at a rate of 1° C./min, and was kept at this temperature for 20 hours. Power to the furnace was then cut off, and it was allowed to cool to ambient.

The resultant oxide was ground, mixed with silver powder, pressed into a composite body and silver foil wrapped, exactly as described in Example 1. The final sintering step involved heating in the tube furnace with continuous oxygen flow to 730° C. at an ascending temperature rate of 1° C./min. This 730° C. temperature was maintained for 24 hours. The furnace power was then cut off and the composite was allowed to cool in the furnace under flowing oxygen.

This composite was tested for superconducting properties, and exhibited a $T_c$ value and Meissner effect very similar to the starting ceramic oxide.

EXAMPLE 3

In this instance, a doped ceramic oxide/elemental metal matrix was fabricated containing 85% by weight $(Bi_{2-x-y}V_xPb_y)Sr_2Ca_2Cu_3O_{10}$ and 15% by weight silver.

Fabrication of the starting ceramic oxide involved mixing appropriate molar ratios of $Bi_2O_3$ (>99.9%), $V_2O_3$, $PbO_2$, $SrO_2$ (>99%) or $SrCO_3$ (>99.95), CaO (>99%) and CuO (>99.95%), followed by grinding the mixture in an agate mortar. The ground powder was first heated in an alumina crucible at 800° C. for about 20 hours. The fired powder was then pelletized in a die using a hydraulic press. The resultant pellets were then placed in a cover alumina cylindrical crucible, and the latter was placed in a tube furnace. The furnace tube was open to air during sintering. The heating cycle involved raising the temperature of the furnace from ambient to about 820° C. at 12° C./min., and this temperature was maintained for 2 days. The temperature of the furnace was then raised to 865°–870° C. at a rate of 1° C./min., and the furnace was maintained at this temperature for 2 days or longer. Thereupon, the furnace temperature was reduced to about 750° C. at a rate of 1°–2° C./min. and maintained at this level for about 20 hours. Furnace power was then cut off, allowing the furnace to cool slowly down to room temperature.

The steps of grinding this oxide, mixing it with elemental metal powder, compression and silver foil wrapping were carried out as in Example 1.

The final sintering step included heating in the tube furnace under oxygen flow to 700° C. at an ascending temperature rate of 1° C./min., and holding at 700° C. for 72 hours. The ends of the tube were then sealed and the material was removed from the furnace immediately to promote quick cooling.

Again, this sample was tested for superconducting characteristics and exhibited a $T_c$ value and Meissner effect very similar to the starting ceramic oxide.

EXAMPLE 4

In this example, an essentially single phase, doped Tl-1223 starting ceramic oxide was prepared, which could be mixed with elemental metal powder and sintered to form composites in accordance with the invention. Specifically, $(Tl_{0.5}Pb_{0.5})Sr_2Ca_2Cu_3O_9$ as prepared using high purity $Tl_2O_3$, SrO, CaO, CuO and $PbO_2$ starting oxides according to the stoichiometry of the desired oxide. The starting oxides were mixed and ground in a mortar, and the powder was then pressed into pellets using a hydraulic press (7,000 kg/cm²). The pellets were then placed in a tubular alumina crucible, which was positioned in a tube furnace. Furnace power was turned on as oxygen flowed slowly through the furnace. The temperature of the furnace was raised to about 945° C. at an ascending rate of 5° C./min., and kept at this elevated temperature for 40 hours. The furnace was then cooled to 850° C. at a descending rate of 0.5° C./min., and the temperature was maintained at this lower level for 10 hours. At this point, the power of the furnace was turned off and the sample was allowed to cool to room temperature in the furnace.

EXAMPLE 5

Another composite material was made using 95% by weight of the Tl-2223 material described in Example 1, and 5% by weight of silver. The fabrication technique was essentially as described in Example 1, with reference to the final sintering conditions using silver as the elemental metal. The superconducting characteristics of this composite were very similar to the pure Tl-2223 ceramic oxide; however, the physical properties of this composite more closely resembled the ceramic oxide, and had a ductility approaching that of the ceramic oxide. This example demonstrates however, that the normal range of preferred elemental metal usage ranges from about 5–20% by weight.

Figure 5:
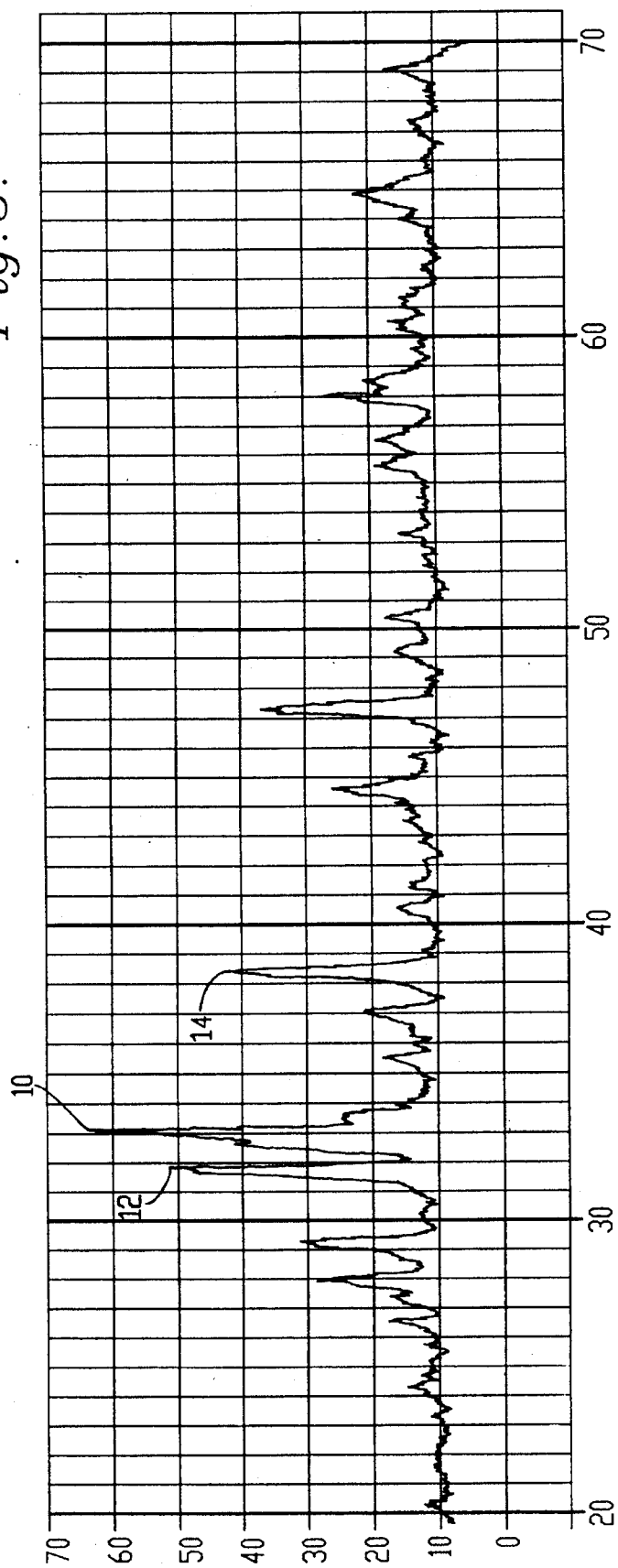
FIG. 5 is an X-ray crystallography graph developed using a composite made up of 85% by weight of a mixed phase Tl -2223/Tl-2212 ceramic oxide, and 15% by weight gold.

FIG. 5 depicts the X-ray crystallography results obtained from an analysis of a mixed phase Tl-2223/Tl-2212 ceramic oxide with gold. The presence of the mixed phases is readily determined from peaks 10 (Tl-2223) and 12 (Tl-2212), whereas the presence of gold is evidenced by peak 14. Despite the presence of mixed phases in the ceramic oxide matrix, which would be predictive of reduced superconducting characteristics, the composites of the invention exhibit characteristics very similar to or even better than their single phase ceramic oxide counterparts.

Figure 6:
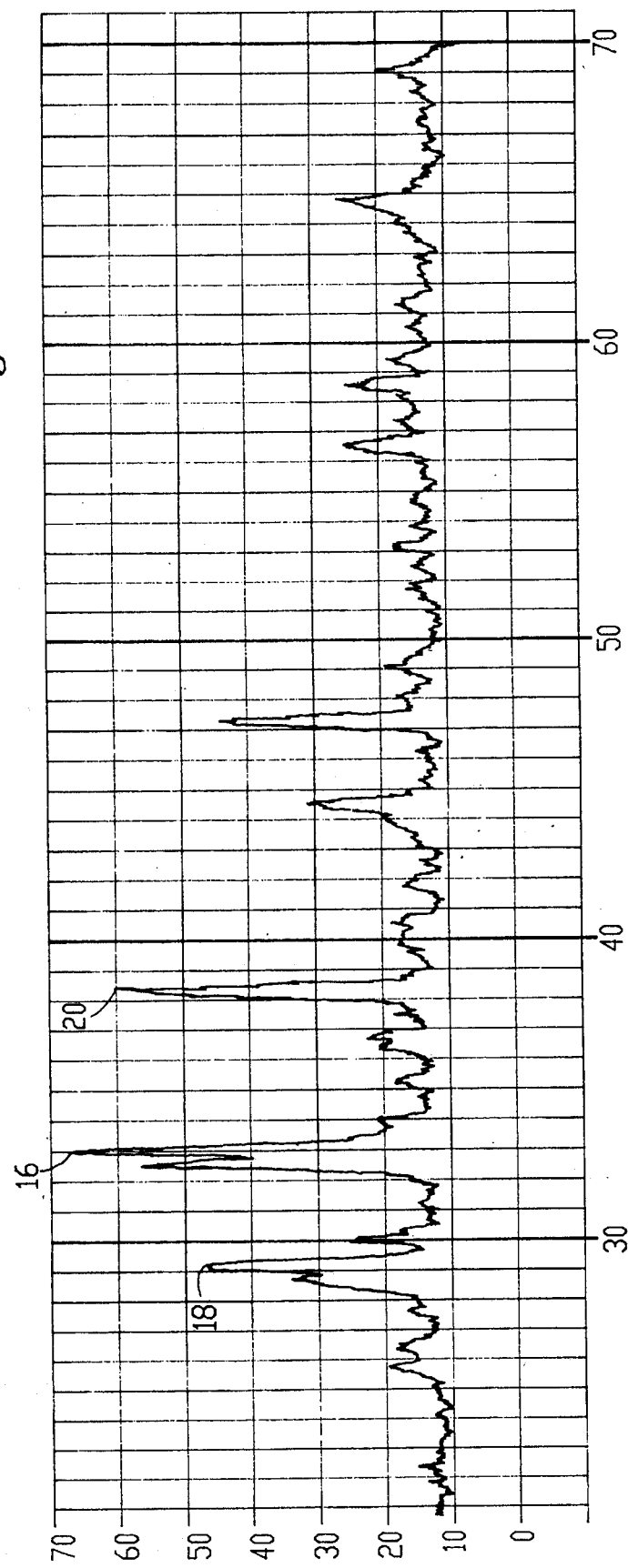
FIG. 6 is an X-ray crystallography graph developed using a composite made up of 85% by weight of a mixed phase Tl-1223/Tl-2223 ceramic oxide, and 15% by weight gold.

FIG. 6 depicts a similar situation with peak 16 demonstrating the presence of Tl-2223 phase and peak 18 establishing the presence of a Tl-1223 phase; peak 20 establishes the presence of the gold matrix.

Figure 7:
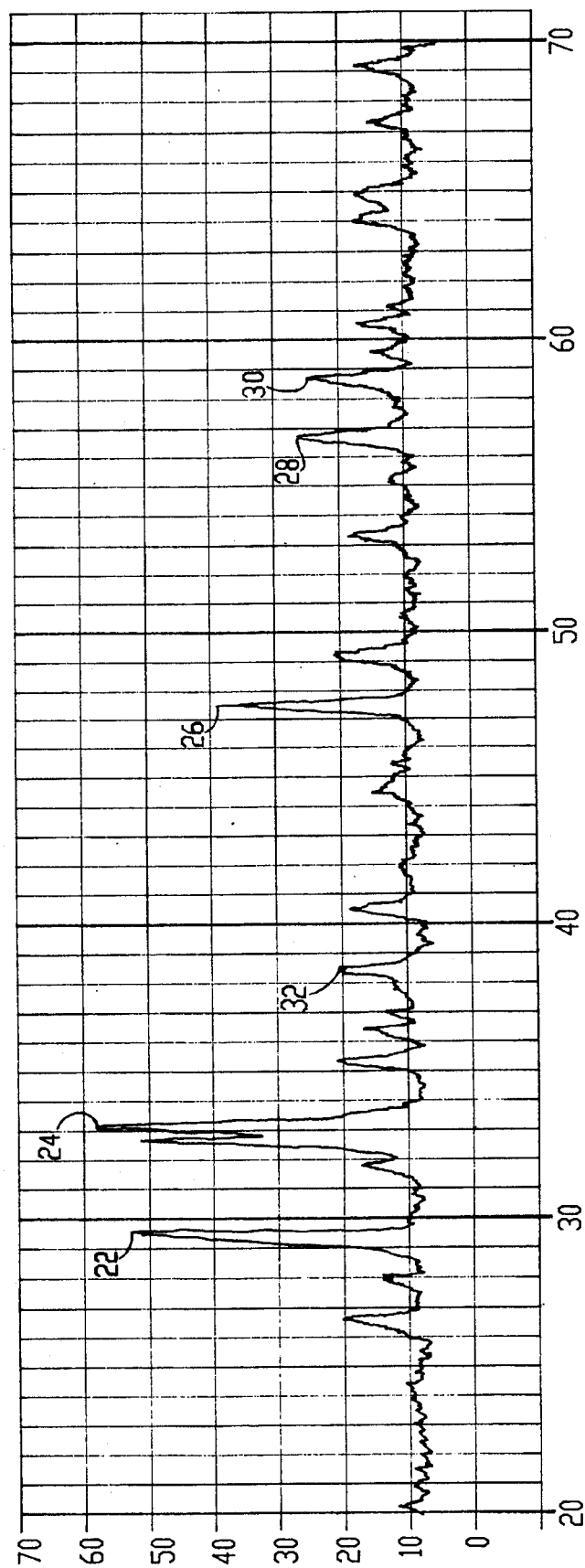
FIG. 7 is an X-ray crystallography graph developed using a composite made up of 90% by weight of essentially single phase Tl-2223 ceramic oxide, and 10% by weight silver.

In FIG. 7, the peaks 22–30 demonstrate the presence of the essentially single phase Tl-2223 oxide, whereas peak 32 establishes the presence of the silver matrix.

Accordingly, these studies confirm that superconducting composites may be produced where the ceramic oxide matrix is either single or multiple phase.

The 80% by weight Tl-2223/20% by weight gold sample described previously was also subjected to an SEM (scanning electron microscope) analysis to better understand the structure of the final composite. This analysis showed that the composite surface was very smooth and essentially covered with a layer of gold metal, while below the gold layer randomly dispersed gold metal was found. This was contrasted with a similar study of the pure Tl-2223 ceramic oxide, which was resintered under similar conditions, which showed a rough surface and a clear indication of grain alignment. Normally, grain alignment enhances critical current density in a superconducting sample. However, the random orientation of the ceramic oxide/elemental metal composites of the invention gives a significantly higher current density, as compared with the resintered starting ceramic oxide. This is a highly surprising result.

Figure 8:
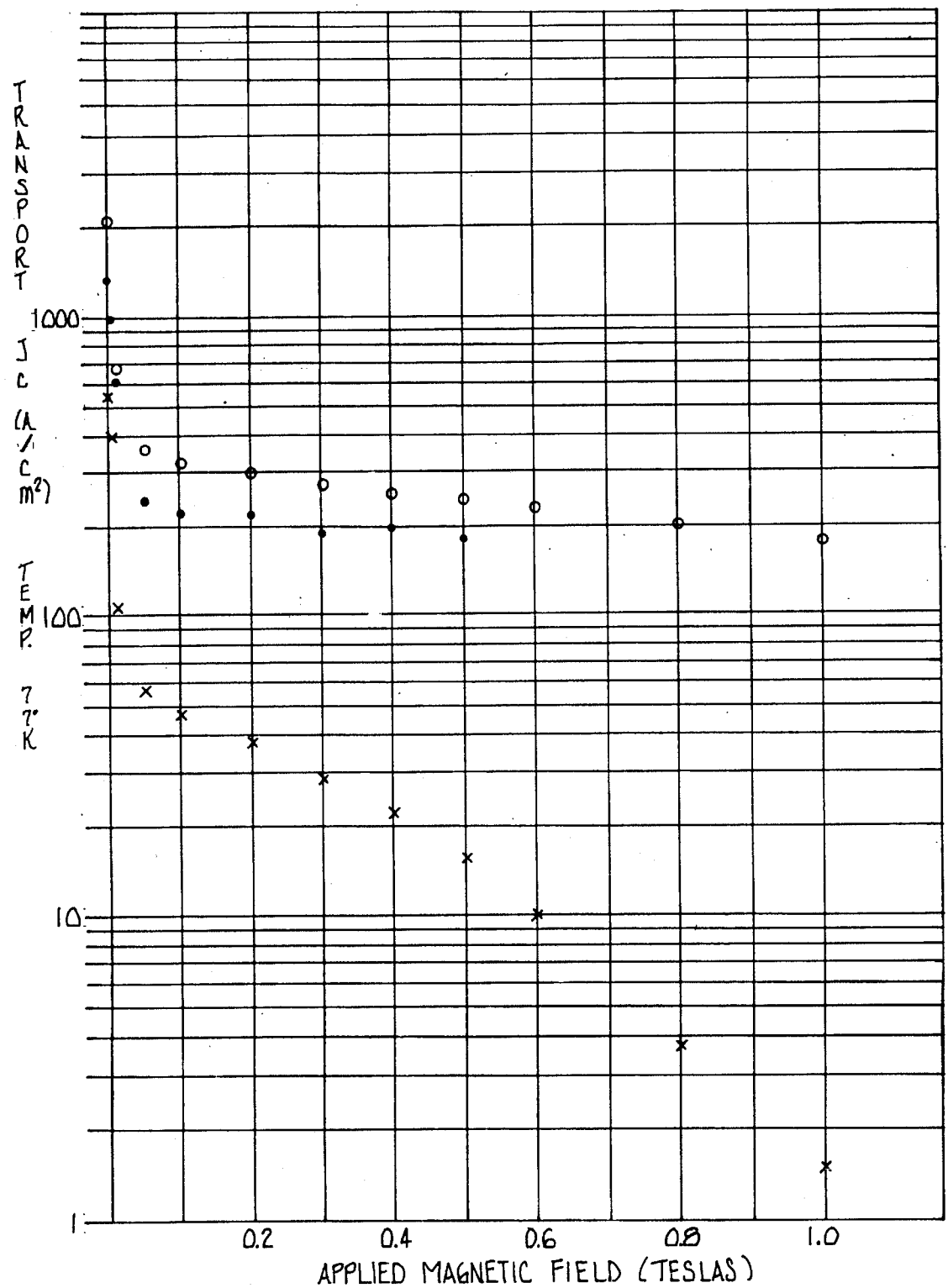
FIG. 8 is a logarithmic graph illustrating the effect of compaction pressures on the measured, D.C. voltage-induced transport current densities of bulk composite superconductors in accordance with the invention.

As indicated previously, it has been found that the high compaction pressures used in fabricating the bulk superconductors in accordance with the invention is an important factor. Attention is directed to FIG. 8 which is a logarithmic graph of transport current densities versus applied magnetic field for three different bulk superconductors. The uppermost set of data points designated by small circles represents a superconducting composite made up of 15% by weight elemental gold and 85% by weight of the Tl-2223 precursor ceramic oxide described in Example 1. In this instance, the compaction pressure was approximately 14 tons/cm². The lowermost set of data points designated by small x's represents a directly comparative test wherein the materials and methods of fabrication were identical, save for the fact that a compaction pressure of 6.5 tons/cm² was used. The intermediate data point set designated by small black dots represents a bulk superconductor made up of 10% by weight elemental silver and 90% by weight of the Example 1 Tl-2223 ceramic oxide. Here again, a 14 tons/cm² compaction pressure was used with this sample.

The test results recorded in FIG. 8 were derived from a series of experiments wherein the three bulk superconductors were tested for transport $J_c$ with the bodies being maintained at about 77K. The applied D.C. voltage was 1µV. As can be seen from the figure, the two samples made using the high compaction pressure exhibited very high transport $J_c$ values, both at zero applied magnetic field, and at 1 Tesla applied field. Note in this respect that the slope of the data points in each case is very shallow, indicating that high transport $J_c$ values will be maintained at even higher applied magnetic field magnitudes. On the other hand, the lower compaction sample gave a relatively low transport $J_c$ at zero applied magnetic field, and the transport $J_c$ fell off very rapidly with increasing applied magnetic field. This indicates that above 1 Tesla applied field, the transport $J_c$ values of this sample would be extremely low.

Figure 9:
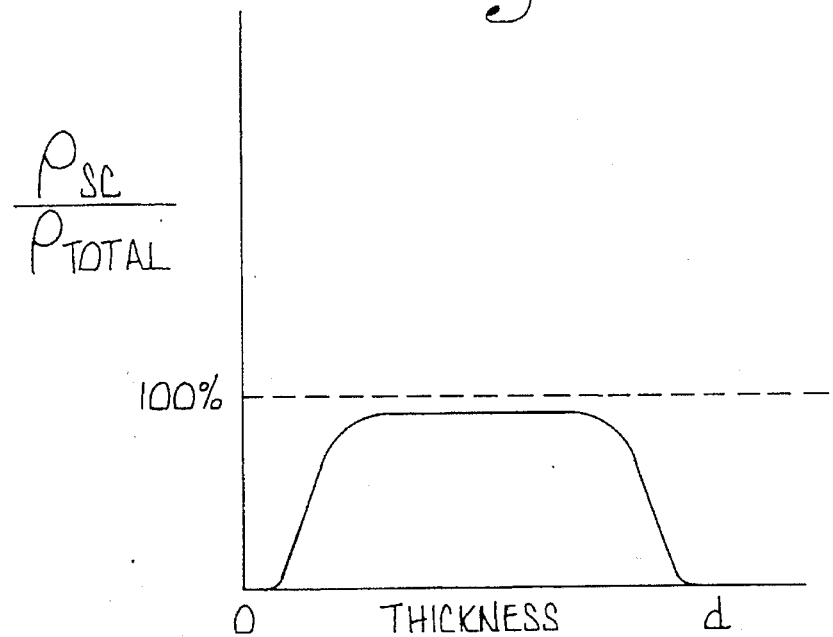
FIG. 9 is a qualitative graph depicting the density of superconducting oxide divided by the total density of a bulk composite superconductor, as a function of the thickness of the superconductor, and illustrating that the superconductors of the present invention have an outer surface layer region formed of elemental metal.
Figure 10:
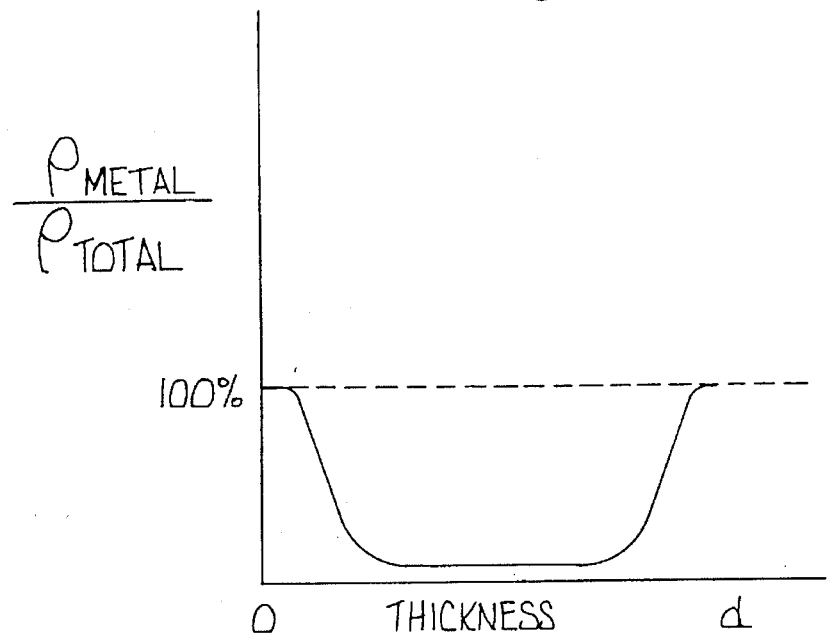
FIG. 10 is a qualitative graph similar to that of FIG. 9, but depicting the density of elemental metal divided by the total density of a bulk composite superconductor, as a function of the thickness of the superconductor, and further illustrating the fact that superconductors in accordance with the invention exhibit an outer surface layer region formed of elemental metal.

The fabrication technique of the invention also produces a unique distribution of elemental metal within the bulk superconductors of the invention. Specifically, in the interior of the bulk bodies, the elemental metal matrix is essentially uniform. However, the outer surface regions of the bodies are made up almost exclusively of elemental metal. This accounts for the fact that in the gold samples described previously, the bodies after compaction exhibited a definite golden luster. This unique metal distribution phenomenon is qualitatively depicted in FIGS. 9 and 10, which are reciprocal graphs. In FIG. 9, the density of the superconducting material versus the total density of the bulk body is plotted as a function of body thickness from zero to "d", the maximum thickness. As seen, at the surface region of the body, the density of superconductor is essentially zero, but is uniform throughout the interior thereof. FIG. 10 is a graph of elemental metal density divided by total density, versus body thickness. Again, it will be observed that the outer surface regions of the body are made up almost entirely of elemental metal.

The preceding examples demonstrated the use of noble metal as the metal matrix in the composites. In these examples, the annealing step gave rise to a completely solid state reaction, inasmuch as neither the precursor superconducting oxide nor the noble metal melted at the annealing temperatures. Where tin constitutes either the entirety of the metal matrix of the composite, or a portion thereof, a partially liquid phase reaction occurs during the annealing step. This stems from the fact that tin melts in the region of 200°–300° C., well below the annealing temperatures employed. Melting of tin during annealing allows the tin to better fill in the gaps between the ceramic grains and, during cooling, the tin resolidifies and thus creates an internal contraction giving a substantially dense composite structure. Finally, tin does not oxidize easily at the annealing temperatures employed, so that tin does not react with the ceramic oxide fraction.

The following examples demonstrate the use of elemental tin in the production of composites.

EXAMPLE 6

In this example, a composite made up of 87% by weight single phase thallium 2223 superconducting oxide, 5% by weight tin and 8% by weight gold was fabricated. The Tl-2223 material was produced and ground exactly as described in Example 1. Thereupon, the tin and gold powders were mixed with the ceramic oxide and ground together using an agate mortar to an average particle size of about $10^{-3}$–$10^{-4}$ mm. In the next step, the ceramic oxide/elemental metal mixture was compressed into a pellet using a hydraulic press at a pressure of about 14 tons/cm². This created a self-sustaining body wherein the metal was formed as a matrix and was situated within the interstices between the ceramic oxide crystalline grains. After compression, the pellets gave the appearance and color of gold.

The final step involved silver foil wrapping and sintering of the compressed body. The sintering conditions were initial heating in flowing oxygen at an ascending temperature rate of about 1° C.–2° C./min. until a temperature of 765° C. was reached, whereupon sintering was carried out at this temperature for 20 hours. The temperature was then lowered at a rate of about 0.5°–1° C./min. until room temperature was reached.

FIGS. 11 and 12 set forth the resistivity and Meissner effect results obtained using the composite of this example. The $T_c$ of the composite was approximately 123.5K, whereas the susceptibility graph, giving an absolute value of 0.016 emu/g, is a qualitative indication that the composite has a very high intragrain critical current density. In this respect, a comparison of FIGS. 12 and 2 will confirm that the tin-containing composite of this example exhibits greater than twice the magnitude of magnetic susceptibility, as compared to the 85% by weight Tl-2223/15% by weight gold composite of FIG. 2. Accordingly, the intragrain $J_c$ of this tin-containing composite will be increased as compared with the intragrain $J_c$ of the composite free of tin.

Figure 14:
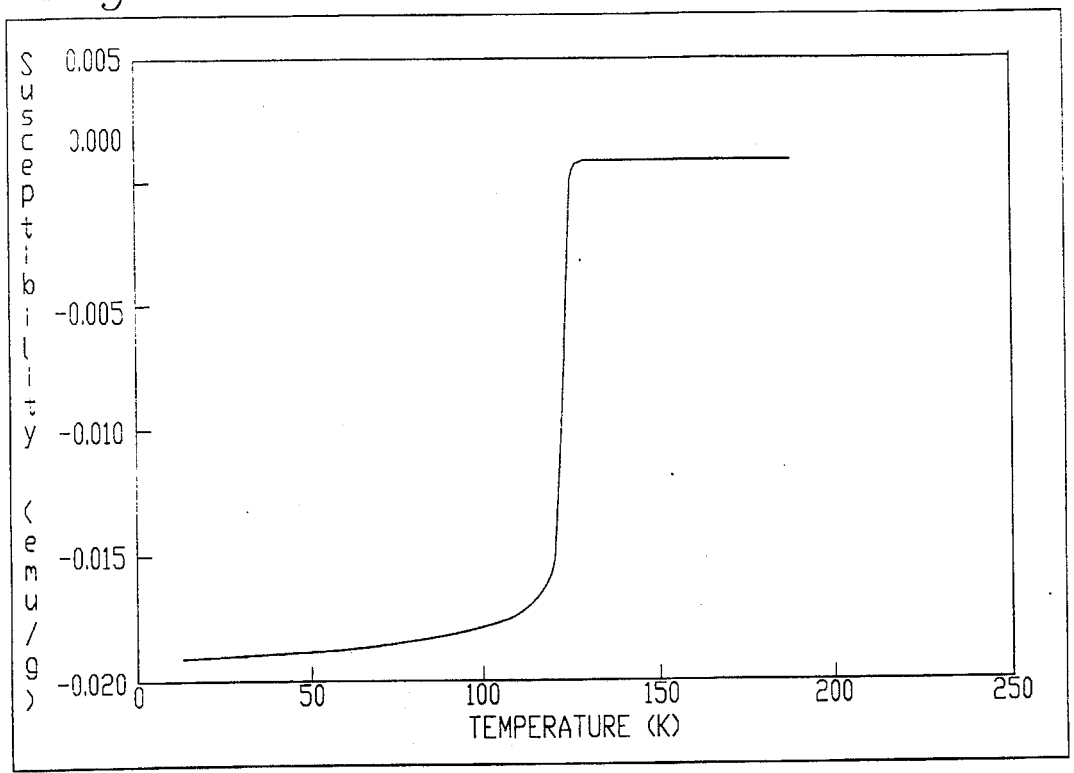
FIG. 14 is a graph of a Meissner effect determination made using the composite of FIG. 13.
Figure 13:
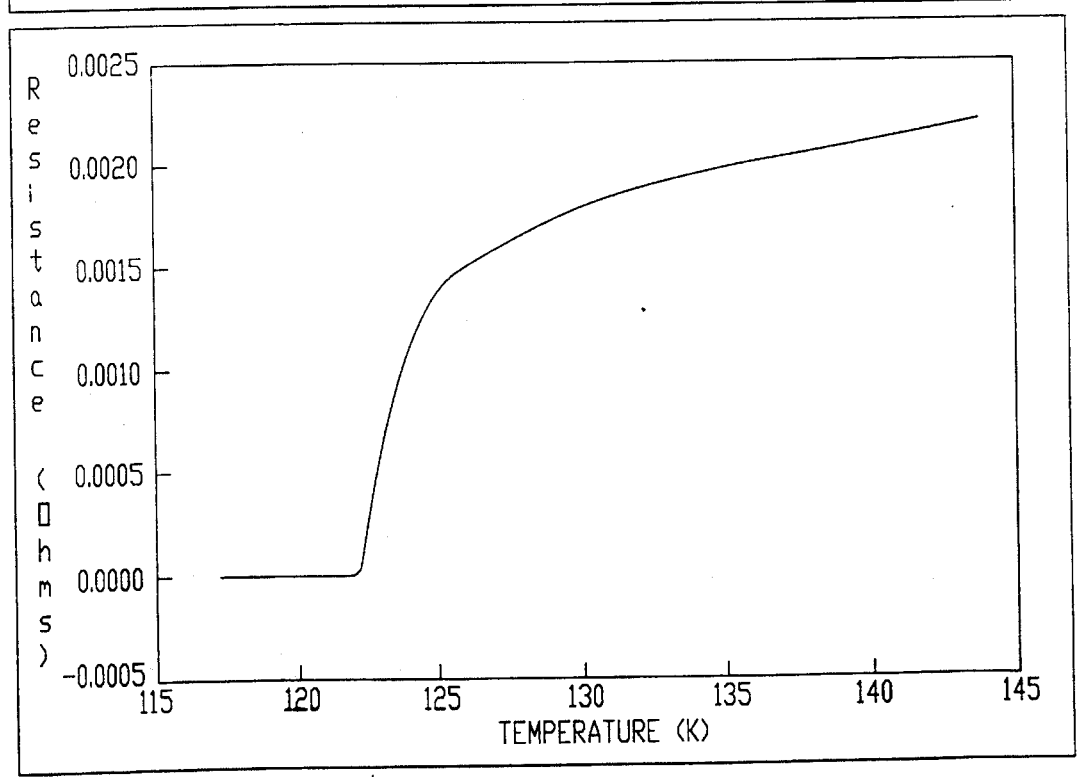
FIG. 13 is a resistivity curve for the composite superconducting material made up of 90% by weight single phase thallium 2223 superconducting oxide, 5% by weight silver, and 5% by weight tin.

In a related example, a composite made up of 90% by weight single phase Tl-2223, 5% by weight tin and 5% by weight silver was fabricated. The steps involved were exactly the same as those set forth immediately above. The resistivity curve of FIG. 13 for this composite demonstrates that it had a $T_c$ of 122K. The composite also exhibited a very high magnetic susceptibility (FIG. 14).

EXAMPLE 7

In this case, a composite was made up of 95% by weight single phase thallium 2223 superconducting oxide and 5% by weight tin; no noble metal was used. The fabrication of this composite proceeded exactly as set forth in Example 6, save for the fact that no noble metal was employed. The compressed body exhibited a silver-gray appearance, indicating that the compressed body had an outer layer of elemental tin. Sintering conditions were exactly as described in Example 6.

The resistivity curve of FIG. 15 showed a $T_c$ for the tin composite of 123K. The susceptibility was 0.014 emu/g (FIG. 16).

We claim:

1. A superconducting composite material comprising a sintered, bulk body formed entirely from compressed first and second matrix-defining particulates and having a thickness of at least about 0.2 mm, wherein said body comprises a first matrix of superconducting ceramic oxide crystalline grains, and a second matrix of elemental metal situated within the interstices between said crystalline grains, said first matrix-defining particulates and the grains of said body being selected from the group consisting of single or mixed phase 1223, 1212, 2212, 2223 and 2201 superconductors, said second matrix-defining particulates and the elemental metal of said body being selected from the group consisting of elemental gold, silver and palladium, said elemental metal matrix being essentially uniform throughout said bulk body except in the region of the surface layer thereof, said elemental metal of said body being derived from said second matrix-defining elemental metal particulates and being the only elemental metal present in said composite material, said body having a layer of essentially continuous elemental metal defining substantially all of the outer surface region of said body, the distribution of elemental metal in said body being at a maximum at the outermost surface of said body wherein it is almost entirely metal, and having a progressively smaller distribution from said outermost surface to a central region of the body where the distribution of said elemental metal is substantially constant, said body being self-sustaining with said layer defining the outermost portion of the body, said layer being continuous with said second matrix, said body exhibiting at least one of a measured, D.C. voltage-induced transport current density of at least about 1,500 amps/cm² at zero applied magnetic field and a body temperature of about 77K, and a measured, D.C. voltage-induced transport current density of at least about 250 amps/cm$^2$ at 1 Tesla applied magnetic field and a body temperature of about 77K.

2. The material of claim 1, said surface region having a thickness of at least about 10 microns.

3. The material of claim 1, said superconducting crystalline grains being present at a level of at least about 40% by weight, based upon the total weight of said material.

4. The material of claim 3, said level being at least about 80% by weight.

5. The material of claim 1, said elemental metal being gold and present at a level of up to about 60% by weight, based upon the total weight of said material.

6. The material of claim 1, said elemental metal being present at a level of up to about 20% by weight.

7. The material of claim 1, said elemental metal being gold.

8. The material of claim 1, said first matrix comprising copper oxide crystalline superconductors including the cubic structure TMCuO$_4$, where M is selected from the group consisting of barium and strontium, and T is selected from the group consisting of bismuth, thallium and vanadium.

9. The material of claim 1, said matrices being present as respective first and second continuous phases.

10. The material of claim 1, said first matrix comprising an essentially single phase superconducting ceramic oxide.

11. The material of claim 1, said first matrix comprising a multiple phase superconducting ceramic oxide.

12. The material of claim 1, said elemental metal being silver.

13. The material of claim 1, said crystalline grains being selected from the group consisting of the Ti:Ba:Ca:Cu:O 2223 and 1223 oxides.

* * * * *